(12) United States Patent
Fischer

(10) Patent No.: US 6,581,029 B1
(45) Date of Patent: Jun. 17, 2003

(54) METHOD AND SYSTEM FOR OPTIMIZING EXECUTION OF A COLLECTION OF RELATED MODULE SEQUENCES BY ELIMINATING REDUNDANT MODULES

(75) Inventor: Stephen E. Fischer, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/310,144

(22) Filed: May 11, 1999

(51) Int. Cl.[7] .............................................. G06F 17/50
(52) U.S. Cl. ................... 703/14; 703/16; 716/1; 716/2; 716/3; 716/18
(58) Field of Search .................. 703/14, 16; 716/2, 716/3, 18, 1

(56) References Cited

U.S. PATENT DOCUMENTS

| | | | | |
|---|---|---|---|---|
| 5,801,958 A | * | 9/1998 | Dangelo et al. | 716/18 |
| 5,805,860 A | * | 9/1998 | Parham | 716/12 |
| 5,838,948 A | * | 11/1998 | Bunza | 703/27 |
| 5,903,475 A | * | 5/1999 | Gupte et al. | 703/16 |
| 5,937,183 A | * | 8/1999 | Ashar et al. | 703/14 |
| 6,026,228 A | * | 2/2000 | Imai et al. | 716/18 |
| 6,477,683 B1 | * | 11/2002 | Killian et al. | 716/1 |

* cited by examiner

Primary Examiner—Samuel Broda
Assistant Examiner—Kandasamy Thangavelu
(74) Attorney, Agent, or Firm—Connolly Bove Lodge & Hutz; Joseph P. Abate

(57) ABSTRACT

A method and system for optimizing the execution of a collection of related modules by eliminating redundant modules from the collection. The collection of modules represent a set of related simulation experiments and are organized as generations of related module sequences having execution interdependencies. The method eliminates redundant modules in the collection by redefining execution interdependencies among the modules. Groups of equivalent modules are formed by comparing the modules within each generation to each other to determine which modules are equivalent. Modules having equivalent execution prerequisites and which will produce the same output given the same input are considered equivalent. In each group of equivalent modules, a single "target" module is selected to substitute for the others in the module execution sequences, and execution interdependencies are redefined to effect the substitution.

10 Claims, 12 Drawing Sheets

| PARENT MODULE(S) | CHILD MODULE(S) | SCRIPT | EXECUTION STATUS |
|---|---|---|---|
| NONE | MODULE 106 | "A" | AWAITING EXECUTION |

100

| PARENT MODULE(S) | CHILD MODULE(S) | SCRIPT | EXECUTION STATUS |
|---|---|---|---|
| NONE | MODULE 106 | "B" | AWAITING EXECUTION |

101

| PARENT MODULE(S) | CHILD MODULE(S) | SCRIPT | EXECUTION STATUS |
|---|---|---|---|
| NONE | MODULE 107 | "A" | AWAITING EXECUTION |

102

| PARENT MODULE(S) | CHILD MODULE(S) | SCRIPT | EXECUTION STATUS |
|---|---|---|---|
| NONE | MODULE 107 | "B" | AWAITING EXECUTION |

103

| PARENT MODULE(S) | CHILD MODULE(S) | SCRIPT | EXECUTION STATUS |
|---|---|---|---|
| NONE | MODULE 108 | "B" | COMPLETE |

104

| PARENT MODULE(S) | CHILD MODULE(S) | SCRIPT | EXECUTION STATUS |
|---|---|---|---|
| NONE | MODULE 109 | "B" | AWAITING EXECUTION |

105

| PARENT MODULE(S) | CHILD MODULE(S) | SCRIPT | EXECUTION STATUS |
|---|---|---|---|
| MODULES 100,101 | MODULE 110 | "C" | AWAITING EXECUTION |

106

| PARENT MODULE(S) | CHILD MODULE(S) | SCRIPT | EXECUTION STATUS |
|---|---|---|---|
| MODULES 102,103 | MODULES 111,112 | "C" | AWAITING EXECUTION |

107

| PARENT MODULE(S) | CHILD MODULE(S) | SCRIPT | EXECUTION STATUS |
|---|---|---|---|
| MODULE 104 | MODULE 113 | "I" | AWAITING EXECUTION |

108

| PARENT MODULE(S) | CHILD MODULE(S) | SCRIPT | EXECUTION STATUS |
|---|---|---|---|
| MODULE 105 | MODULE 114 | "I" | AWAITING EXECUTION |

| PARENT MODULE(S) | CHILD MODULE(S) | SCRIPT | EXECUTION STATUS | 110 |
|---|---|---|---|---|
| MODULE 106 | MODULE 115 | "D" | AWAITING EXECUTION | |

| PARENT MODULE(S) | CHILD MODULE(S) | SCRIPT | EXECUTION STATUS | 111 |
|---|---|---|---|---|
| MODULE 107 | MODULE 116 | "F" | AWAITING EXECUTION | |

| PARENT MODULE(S) | CHILD MODULE(S) | SCRIPT | EXECUTION STATUS | 112 |
|---|---|---|---|---|
| MODULE 107 | MODULE 116 | "G" | AWAITING EXECUTION | |

| PARENT MODULE(S) | CHILD MODULE(S) | SCRIPT | EXECUTION STATUS | 113 |
|---|---|---|---|---|
| MODULE 108 | MODULE 117 | "I" | AWAITING EXECUTION | |

| PARENT MODULE(S) | CHILD MODULE(S) | SCRIPT | EXECUTION STATUS | 114 |
|---|---|---|---|---|
| MODULE 109 | MODULE 118 | "J" | AWAITING EXECUTION | |

| PARENT MODULE(S) | CHILD MODULE(S) | SCRIPT | EXECUTION STATUS | 115 |
|---|---|---|---|---|
| MODULE 110 | NONE | "E" | AWAITING EXECUTION | |

| PARENT MODULE(S) | CHILD MODULE(S) | SCRIPT | EXECUTION STATUS | 116 |
|---|---|---|---|---|
| MODULES 111,112 | NONE | "H" | AWAITING EXECUTION | |

| PARENT MODULE(S) | CHILD MODULE(S) | SCRIPT | EXECUTION STATUS | 117 |
|---|---|---|---|---|
| MODULE 113 | NONE | "K" | AWAITING EXECUTION | |

| PARENT MODULE(S) | CHILD MODULE(S) | SCRIPT | EXECUTION STATUS | 118 |
|---|---|---|---|---|
| MODULE 114 | NONE | "L" | AWAITING EXECUTION | |

FIG. 3B

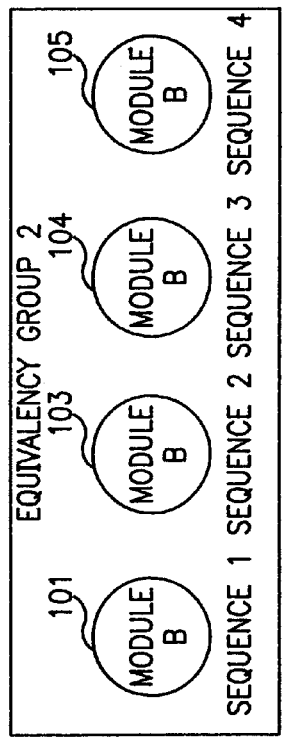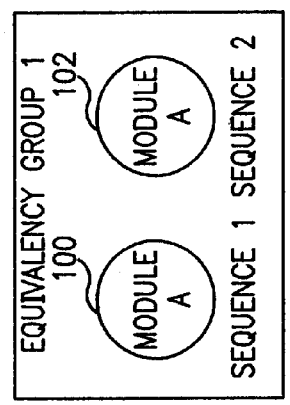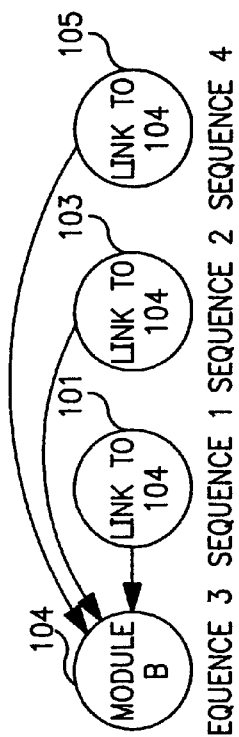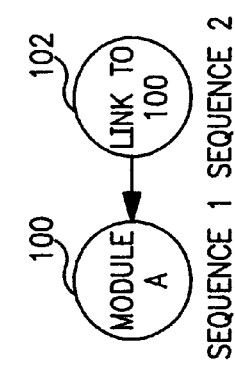
FIG. 4A
FIG. 4B

| PARENT MODULE(S) | CHILD MODULE(S) | SCRIPT | EXECUTION STATUS | 110 |
|---|---|---|---|---|
| MODULE 106 | MODULE 115 | "D" | AWAITING EXECUTION | |

| PARENT MODULE(S) | CHILD MODULE(S) | SCRIPT | EXECUTION STATUS | 111 |
|---|---|---|---|---|
| MODULE 107 | MODULE 116 | "F" | AWAITING EXECUTION | |

| PARENT MODULE(S) | CHILD MODULE(S) | SCRIPT | EXECUTION STATUS | 112 |
|---|---|---|---|---|
| MODULE 107 | MODULE 116 | "G" | AWAITING EXECUTION | |

| PARENT MODULE(S) | CHILD MODULE(S) | SCRIPT | EXECUTION STATUS | 113 |
|---|---|---|---|---|
| MODULE 108 | MODULE 117 | "J" | AWAITING EXECUTION | |

| LINK TO 113 | 114 |
|---|---|

| PARENT MODULE(S) | CHILD MODULE(S) | SCRIPT | EXECUTION STATUS | 115 |
|---|---|---|---|---|
| MODULE 110 | NONE | "E" | AWAITING EXECUTION | |

| PARENT MODULE(S) | CHILD MODULE(S) | SCRIPT | EXECUTION STATUS | 116 |
|---|---|---|---|---|
| MODULES 111,112 | NONE | "H" | AWAITING EXECUTION | |

| PARENT MODULE(S) | CHILD MODULE(S) | SCRIPT | EXECUTION STATUS | 117 |
|---|---|---|---|---|
| MODULE 113 | NONE | "K" | AWAITING EXECUTION | |

| PARENT MODULE(S) | CHILD MODULE(S) | SCRIPT | EXECUTION STATUS | 118 |
|---|---|---|---|---|
| MODULE 114 | NONE | "L" | AWAITING EXECUTION | |

FIG. 7B

METHOD AND SYSTEM FOR OPTIMIZING EXECUTION OF A COLLECTION OF RELATED MODULE SEQUENCES BY ELIMINATING REDUNDANT MODULES

CROSS REFERENCE TO RELATED APPLICATIONS

This application is related by common inventorship and subject matter to co-pending application Ser. Nos. 09/239,941, 09/239,942 and 09/239,943, titled "Context Tree for Providing User-Defined Execution Contexts for Simulation Control Programs", "Sequential Text Editor With Dynamically Updated Tree-Structured, Directed-Line Graphic Representation of Text" and "Method and Apparatus for Processing Executable Program Modules Having Multiple Dependencies" respectively, assigned to International Business Machines Corporation and entirely incorporated herein by this reference.

BACKGROUND OF THE INVENTION

The present invention relates to the semiconductor device simulation art. Specifically, a computer-implemented method and system is described which increases efficiency in the processing of executable modules representing steps in the creation and testing of simulated semiconductor devices, by eliminating redundant modules from the process flow.

The creation and testing of semiconductor devices through simulation, prior to actual manufacture, provides significant savings in design cost and time. TCAD (Technology Computer-Aided Design) is one well-known methodology for performing design through simulation, focusing on the design of structures at the silicon level.

In the TCAD system, designers create simulation control "recipes", which are computer-executable scripts defining a set of process steps to be performed by a simulation processor in the creation of a simulated device. The simulation processor, under the control of a simulation control script, produces an output data file representing a virtual semiconductor device, such as a transistor. This output data file may then be studied by a designer, and may further be input to a device test simulation processor which simulates the response of the virtual device to a selected test of its electrical properties.

The process steps defined by the simulation control scripts reflect process steps used in the actual manufacture of semiconductor devices. Variables in the process steps include, for example, dosages and energies for implantation of impurities into a silicon wafer, annealing times and temperatures, and mask layout. It is of interest to designers to determine values for these variables so as to produce a device with desired or optimal electrical properties; simulation makes this convenient and cost-effective, since no physical device need be constructed. Instead, a collection of simulation control scripts may be constructed, each script defining a different set of values for process variables and representing a particular simulation experiment. The simulation control scripts may then be executed, and the resulting virtual devices may be tested and compared.

Such a collection of simulation control scripts can be quite numerous, owing to numerous varying parameters having been defined for the process steps. Moreover, the time required by the simulation processor to perform the computations necessary for simulation can be substantial, ranging from hours to days.

Accordingly, an approach to processing a collection of simulation control scripts is called for which minimizes the number of simulation control scripts which need to be executed, thereby reducing the simulation system load, speeding design evaluation and further reducing design costs.

SUMMARY OF THE INVENTION

A method and system according to the present invention provides an approach to processing a collection of simulation control scripts which meets the foregoing objective, and which is not known to exist in the prior art. The method exploits commonalities in a collection of modules containing scripts to be executed, to eliminate redundant modules from the execution process.

The collection of modules represents a set of related simulation experiments and are organized as generations of related module sequences having execution interdependencies. The related sequences typically include common module sequences, followed by one or more points known as "splits" at which the sequences diverge, representing points at which a variation in process parameters has been introduced by a user of the simulation system.

The method according to the present invention organizes the common module sequences preceding splits into groups of equivalent modules, and then eliminates redundant modules in each group. In a preferred embodiment, the groups of equivalent modules are formed by comparing the modules within each generation to each other to determine which modules are equivalent. Modules which will produce the same output data given the same input data, and which have equivalent execution prerequisites, are considered equivalent.

In each group of equivalent modules, a single "target" module is selected to substitute for the others in the module execution sequences, and execution interdependencies are redefined to effect the substitution. When the collection of modules is subsequently executed, execution is optimal in that redundant modules have been eliminated from the sequences, making it possible to realize a significant savings in simulation time and a reduction of the workload on the simulation system.

DESCRIPTION OF THE DRAWINGS

FIGS. 3A and 3B show a directory structure for implementing the execution interdependencies of FIG. 2;

FIG. 4A shows generation 1 equivalency groups;

FIG. 4B shows target modules within the generation 1 equivalency groups, with associated linked (redundant) modules;

FIGS. 7A and 7B show the same information as FIG. 6 in terms of directory contents;

DETAILED DESCRIPTION OF THE INVENTION

Figure 1:
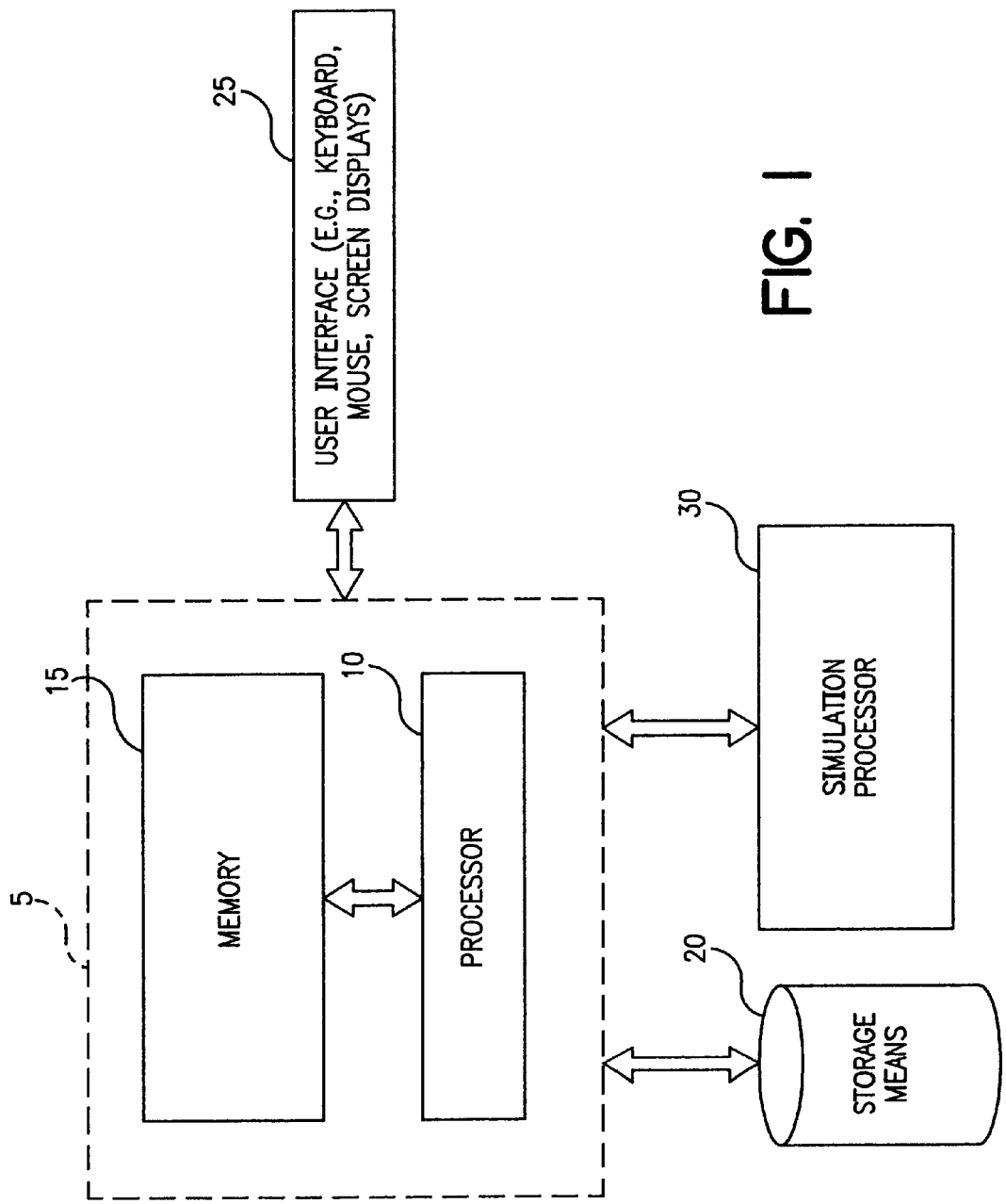
FIG. 1 shows a high-level representation of a computer system for implementing an embodiment of the present invention.

FIG. 1 shows a high-level representation of a computer system for implementing a preferred embodiment of the present invention. The computer system represents a known and commercially available hardware and software platform for the invention, and comprises a processing system 5 including a processor 10, memory 15, computer-usable storage means 20, and a user interface 25 allowing for user interaction with the system. A computer program comprising computer-executable instructions for performing method steps according to the present invention may reside on a computer-usable medium such as storage means 20. To perform the steps of the method, computer instructions according to the present invention may be retrieved from storage means 20 into memory 15, and executed by a processor 10. The programming structures and functionality disclosed herein for performing the method may find specific implementations in a variety of forms, which are considered to be within the abilities of a programmer of ordinary skill in the art after having reviewed the specification.

According to the preferred embodiment, the method steps of the present invention are applied to data comprising a collection of executable modules representing steps in a simulation process flow. The executable modules include simulation control scripts written in a high-level programming language such as Tcl/Tk, along with associated execution sequence and status information. After having been processed according to the method of the present invention to eliminate redundant modules, the modules may be executed to provide control input to a simulation processor 30 for producing and/or testing one or more virtual devices.

As is described in detail in the related applications noted above, a given sequence of executable modules represents a particular experiment designed by a user, typically a process or device engineer, for determining the effect of varying parameters in process steps on the electrical properties of a simulated semiconductor device. The above-noted applications also describe in detail how such modules are created and stored.

A collection of related experiments typically includes experiments having sequences of modules in common, but further having one or more points known as "splits" at which the sequences diverge, representing points at which a variation in process parameters has been introduced by a user.

Figure 2:
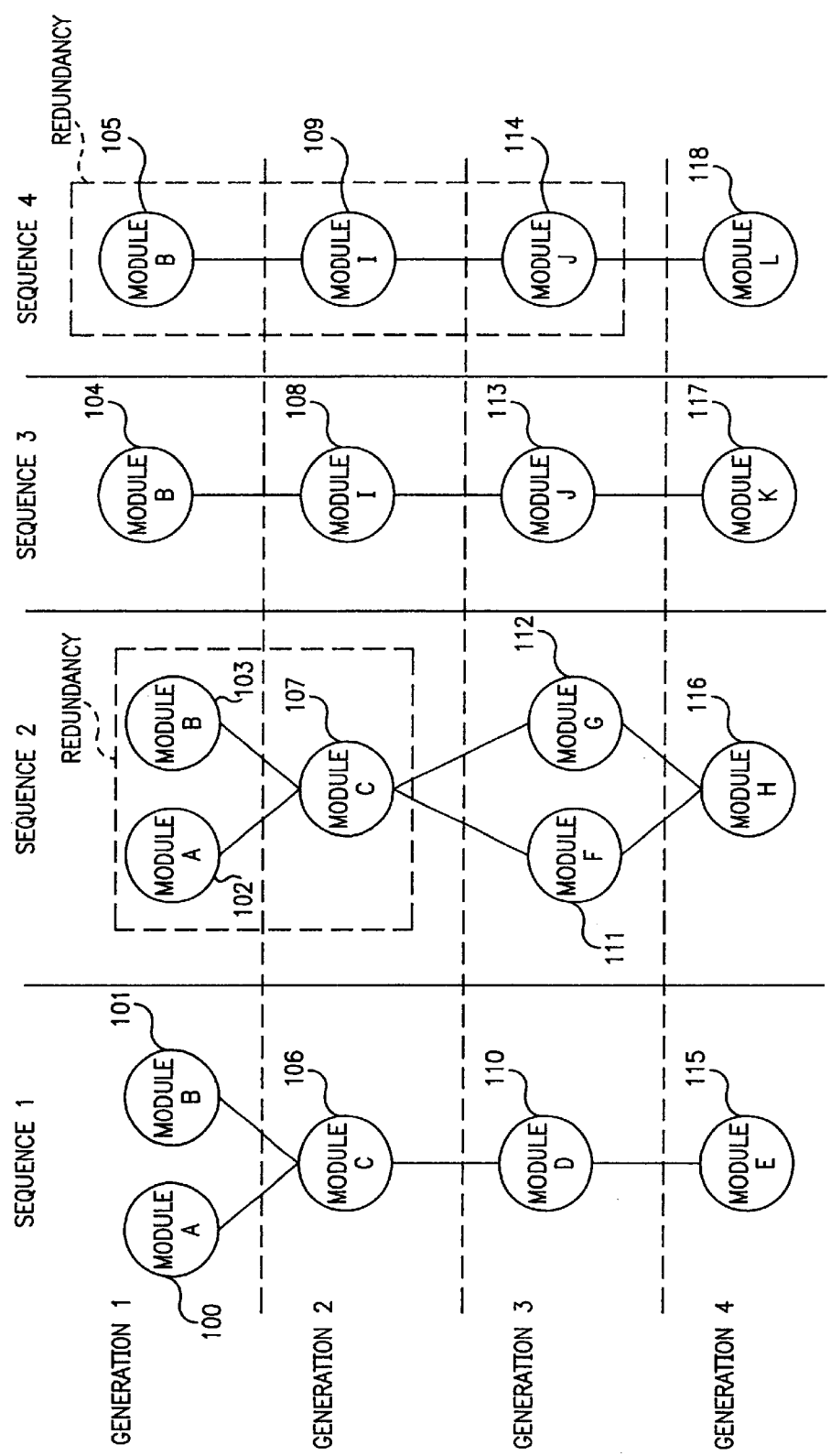
FIG. 2 shows an example of a collection of executable modules organized as generations of related module sequences having execution interdependencies.

FIG. 2 shows an example of commonalities in module sequences such as typically occur in a collection of related experiments. Modules designated with identical letters (A–L) are to be considered as containing identical scripts (i.e., given identical input, the scripts will produce identical output). Thus, modules 102, 103 and 107 have scripts identical to the scripts of modules 100, 101 and 106, respectively, and modules 105, 109 and 114 have scripts identical to the scripts of modules 104, 108 and 113, respectively. A split between sequences 1 and 2 occurs at generation 3, and a split between sequences 3 and 4 occurs at generation 4, since at these points, the scripts are different.

In the execution of a sequence of modules for an experiment, interdependencies between modules must be accounted for. A module in an execution sequence may have one or more prerequisites, and its execution must be delayed until the prerequisite modules have executed to provide the necessary input.

In the example of FIG. 2, execution interdependencies are represented by connecting lines. Modules at a generation level lower (numerically) than the generation level of a connected module must execute and complete earlier than the higher-level-generation connected module. Thus, for example, modules 100 and 101 must execute before module 106, modules 104, 108 and 113 must execute before module 117, and so on.

The method of the present invention exploits commonalities in module sequences such as those illustrated in FIG. 2 to minimize the number of modules which need to be executed in a collection of related experiments. Because module sequences preceding splits often include modules with identical scripts and equivalent prerequisites, only one such module sequence need be executed, and the resulting data can be fed at the split points into diverging module sequences of higher generations. The method of the present invention performs a restructuring of execution interdependencies in order to realize this possibility.

Referring now to FIG. 2 as an illustrative example of a collection of experiments to which the method may advantageously be applied, execution interdependencies are conveniently referred to in terms of "ancestry". Thus, execution prerequisites, represented by generationally lower-level connected modules, are hereinafter referred to as "parent" modules, while higher-level connected modules are called "child" modules. Thus, in FIG. 2, modules 100 and 101 are the parent modules of module 106, module 110 is the child module of module 106, and so on.

A structure such as that represented by sequence 1 in FIG. 2 is known as a "directed acyclic graph" (DAG). A DAG is characterized in that, as opposed to a more specialized "tree" structure, a node or vertex in the DAG (here, a module) may have multiple parent nodes. Thus, sequence 2 is also a DAG.

According to the preferred embodiment, the structures of FIG. 2 are implemented on storage means such as storage means 20 in a set of directories linked by a system of pointers. Each executable module is a directory containing a simulation control script, along with information relating to the execution interdependencies and execution status of the script. Directories implementing the structure of FIG. 2 are illustrated in FIGS. 3A and 3B.

Referring now to FIGS. 3A and 3B, each executable module 100–118 includes execution interdependency information comprising at a minimum either the parent modules, if any, or the child modules, if any; either may be derived from the other. For convenience of illustration, both parent and child information is included in the modules shown in FIGS. 3A and 3B. The modules further comprise a simulation control script written in a high-level programming language (represented here by single uppercase letters A–L); and an execution status, which can indicate that the module is either awaiting execution, is currently executing, or has completed execution.

The generations shown in FIG. 2 are defined by the information in the modules shown in FIGS. 3A and 3B. For example, modules 100–105 are parentless modules, and consequently form generation 1. Modules 106–109 each have generation 1 modules as parents, and consequently form generation 2. Generations 3 and 4 are similarly defined.

Related application Ser. No. 09/239,943, "Method and Apparatus for Processing Executable Program Modules Having Multiple Dependencies", describes in detail how the information shown in FIGS. 3A and 3B is used to manage the execution of such a collection of modules to account for execution interdependencies, and in particular when the process flow includes DAG structures. To summarize briefly, parentless modules are executed first, since they have no prerequisites. When a module has begun or completed execution, its execution status information is updated accordingly. Parent execution status for each child module is monitored, and when all parents of a child module have completed execution, the child module is added to a list of runable jobs to be farmed out to an available processor in a multiprocessor system.

The method according to the present invention optimizes the collection of executable modules to be processed as described in the foregoing paragraph, and comprises the fundamental steps of:

1) organizing executable modules representing a collection of related experiments into groups of equivalent modules; and 2) eliminating redundant modules in each group.

Step 1 may be further subdivided into the steps of:

a) for each generation level, comparing the modules to determine which are equivalent; and b) assigning equivalent modules to the same groups.

Step 2 may be further subdivided into the steps of:

a) for each group of equivalent modules at each generation level, selecting a "target" module; all others are redundant; and b) replacing each redundant module with a reference to the target module, in order to redefine the execution interdependencies of the modules.

For purposes of carrying out the foregoing steps, modules are equivalent if:

1) they have equivalent ancestry, and 2) given the same input data, they will produce the same output data.

Modules have equivalent ancestry if:

1) they have the same number of parent modules, and 2) corresponding parent modules are equivalent.

Figure 9A:
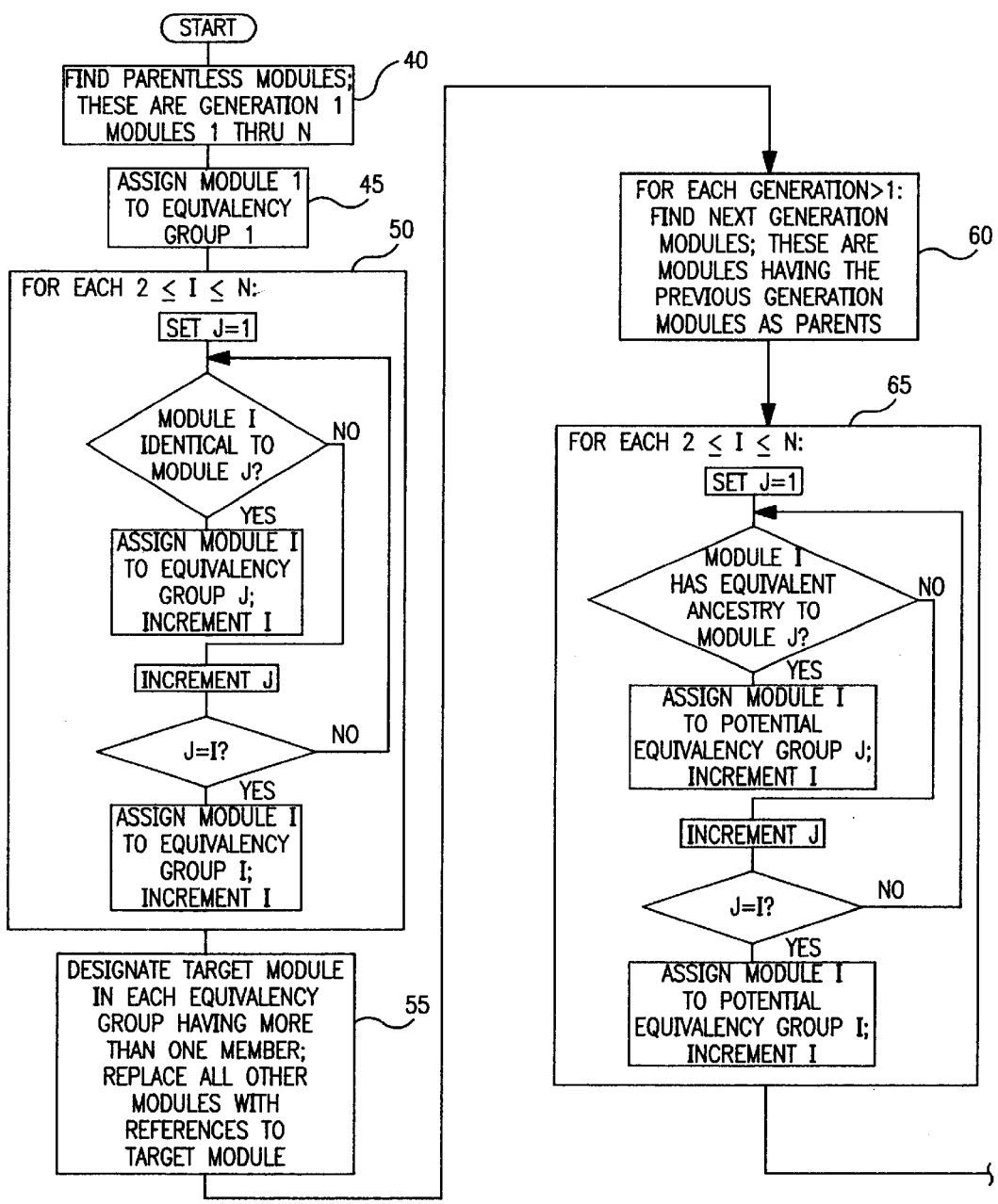
FIGS. 9A and 9B show a flowchart of the basic logic of an embodiment of the method.
Figure 9B:
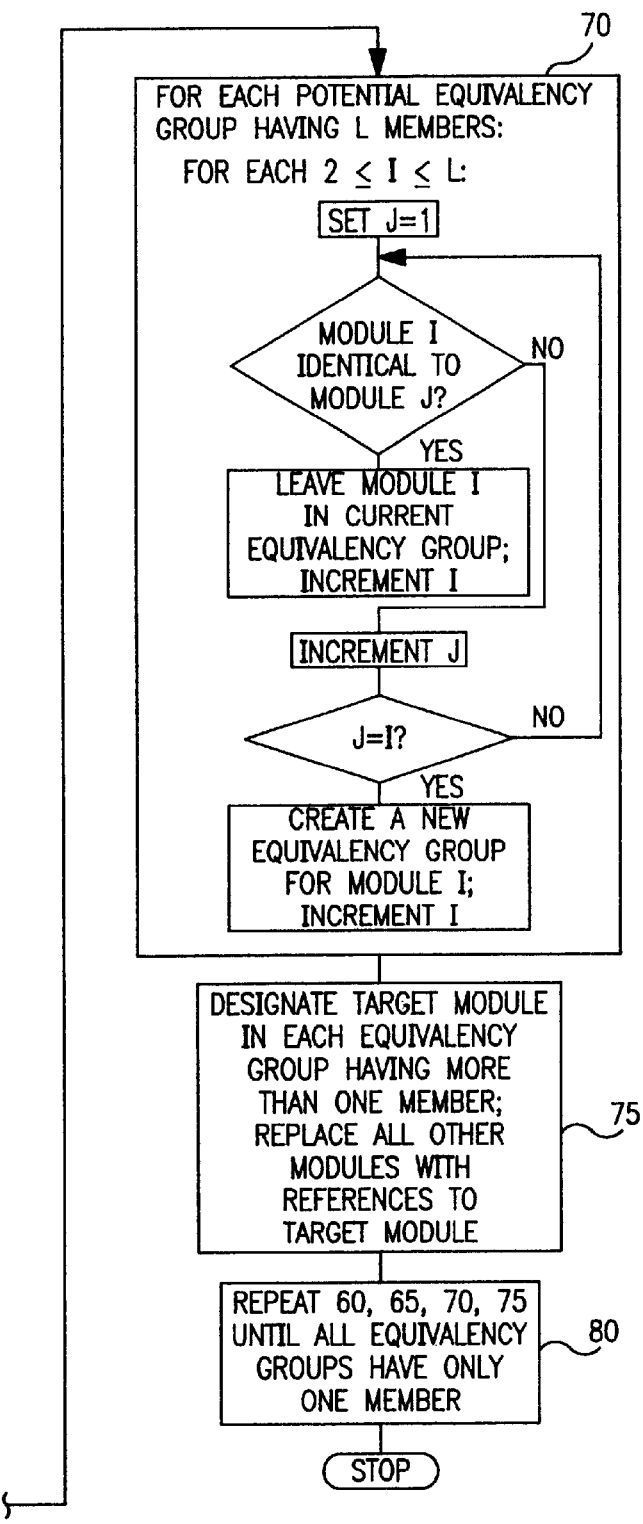

Basic logic flow for an implementation of the foregoing steps is illustrated in FIGS. 9A and 9B. The operations described in the following will be understood to be occurring in a computer memory such as memory 15 under the control of a processor such as processor 10 executing instructions according to the method of the present invention.

As shown in block 40, generation 1 modules are determined by examining the parent information for the modules as shown in FIGS. 3A and 3B. Parentless modules have no prerequisites, and consequently form the generation 1 modules. Parentless modules have equivalent ancestry because they have no ancestry, and thus all that needs to be determined for generation 1 modules is which of them, given the same input data, will produce the same output data. In the embodiment under discussion, the foregoing condition is met when the modules contain scripts (fully expanded if they contain macro references of any sort) which are letter-for-letter identical.

Given a number N of generation 1 modules, one module is arbitrarily assigned to equivalency group 1, as shown in block 45. At this point, "equivalency group 1" simply refers to a newly-created classification for the modules which might or might not ultimately contain more than one equivalent member.

Next, the modules are systematically compared to determine which of the modules contain identical scripts, using, for example, an indexed looping procedure such as that shown in block 50. Modules containing identical scripts are assigned to the same equivalency group. If a match is not found for a module in an existing equivalency group, a new equivalency group is generated for the module.

After a routine such as that shown in block 50 is performed, up to N equivalency groups will have been created, although ideally there will be fewer than N equivalency groups, indicating that some of the modules are equivalent, and consequently redundant and suitable for elimination.

Next, using the execution status information shown in FIGS. 3A and 3B, a target module is selected for each equivalency group in generation 1. Block 55 depicts this step. Typically, the most mature module is selected as the target, by testing first for whether any module has completed execution, then for whether any module is currently executing. By selecting an already-executed or executing module as the target module, further time savings can be realized. If a mature module cannot be found, the target module is selected arbitrarily.

All modules in each equivalency group not selected as the target module are redundant, so they are replaced by references to the target module. This is implemented by issuing a "link" command to the file system supporting the module directories, which generates pointers causing all references to a linked directory to be directed to a target directory. Effectively, the contents of a linked directory are replaced by those of the target, accomplishing a redefinition of execution interdependencies.

The generations succeeding generation 1 are processed next, as shown in blocks 65–80. The modules of these higher-level generations are first organized into potential equivalency groups, by testing whether any modules have equivalent ancestry, as shown in block 65. Block 65 illustrates a routine for finding potential equivalency groups for a generation having a number K of modules. Then, actual equivalency groups are determined by determining which modules within a potential equivalency group contain identical scripts, as shown in block 70. Block 70 illustrates a routine for assigning actual equivalency groups for a potential equivalency group having L members.

In block 75, target modules are designated for each actual equivalency group having more than one member. All other modules are replaced by references to the target module.

As shown in block 80, the steps of blocks 60, 65, 70 and 75 are repeated until all equivalency groups have only one member; i.e., a target module with associated reference modules; then processing stops.

Application of the above-described steps will be illustrated using the example of FIG. 2, and related FIGS. 3A–9B.

First, using the system of pointers shown in FIGS. 3A and 3B, it is determined which are the generation 1 modules; these are the parentless modules 100, 101, 102, 103, 104 and 105. These modules have equivalent ancestry because they have no ancestry.

Module 100 is assigned to equivalency group 1. Next, module 101 is compared with module 100 to determine whether the two modules contain identical scripts.

Modules 100 and 101 scripts are not identical (module 100 contains script "A" and module 101 contains script "B"). Thus, module 101 is assigned to new equivalency group 2.

Next, module 102 is compared with module 100. Modules 100 and 102 are equivalent, because they contain identical scripts and have equivalent ancestry. Thus, module 102 is assigned to equivalency group 1 with module 100.

Next, module 103 is compared with module 100. They do not contain identical scripts, so module 103 is compared with module 101. Modules 101 and 103 are equivalent, because they contain identical scripts and have equivalent ancestry. Thus, module 103 is assigned to equivalency group 2 with module 101.

The foregoing routine is repeated for each of the generation 1 modules. FIG. 4A shows the resulting equivalency groups for generation 1.

All equivalency groups for generation 1 have now been determined. Next, target modules are designated. As shown in FIGS. 3A and 3B, in this example modules 100 and 102 are both awaiting execution, so module 100 is arbitrarily selected as the target module in equivalency group 1. In equivalency group 2, module 104 has completed execution, so it is selected as the target module.

Figure 7A:
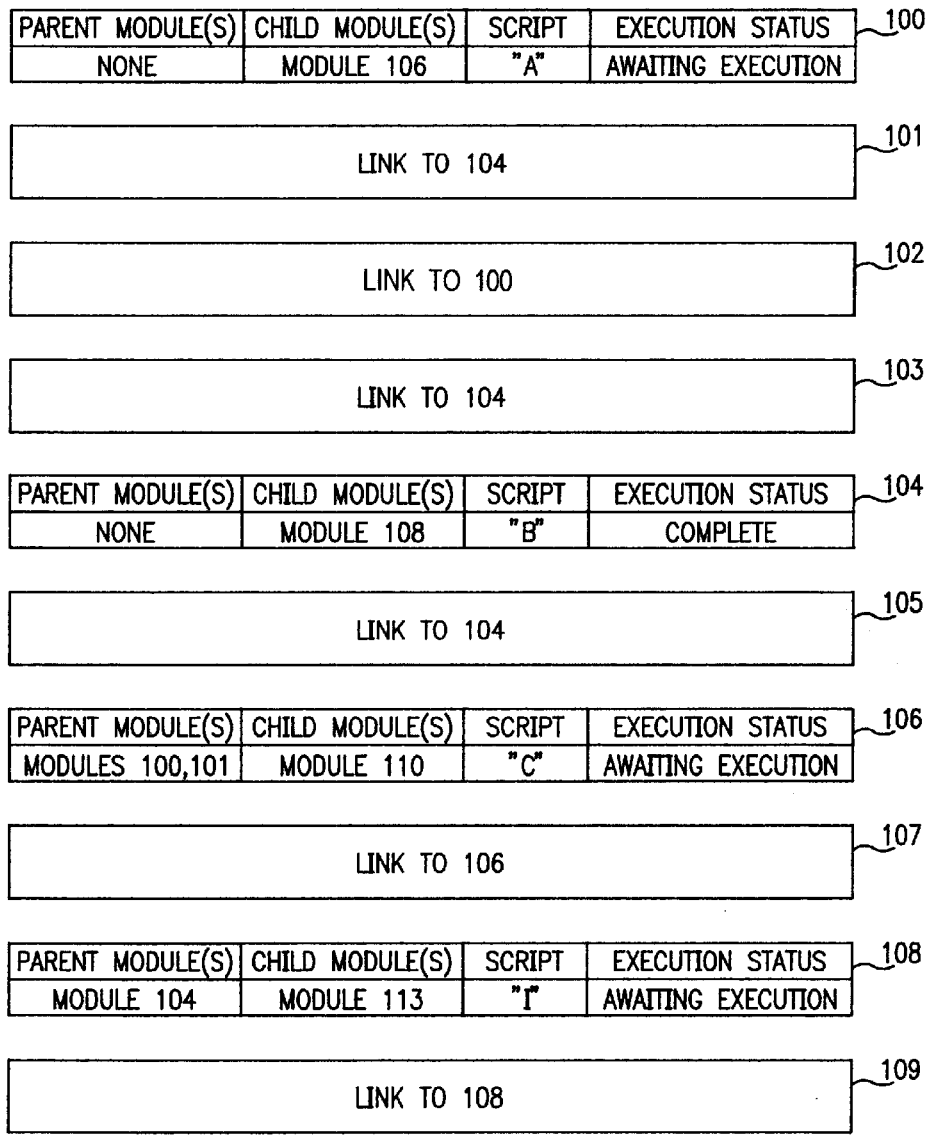
Figure 8:
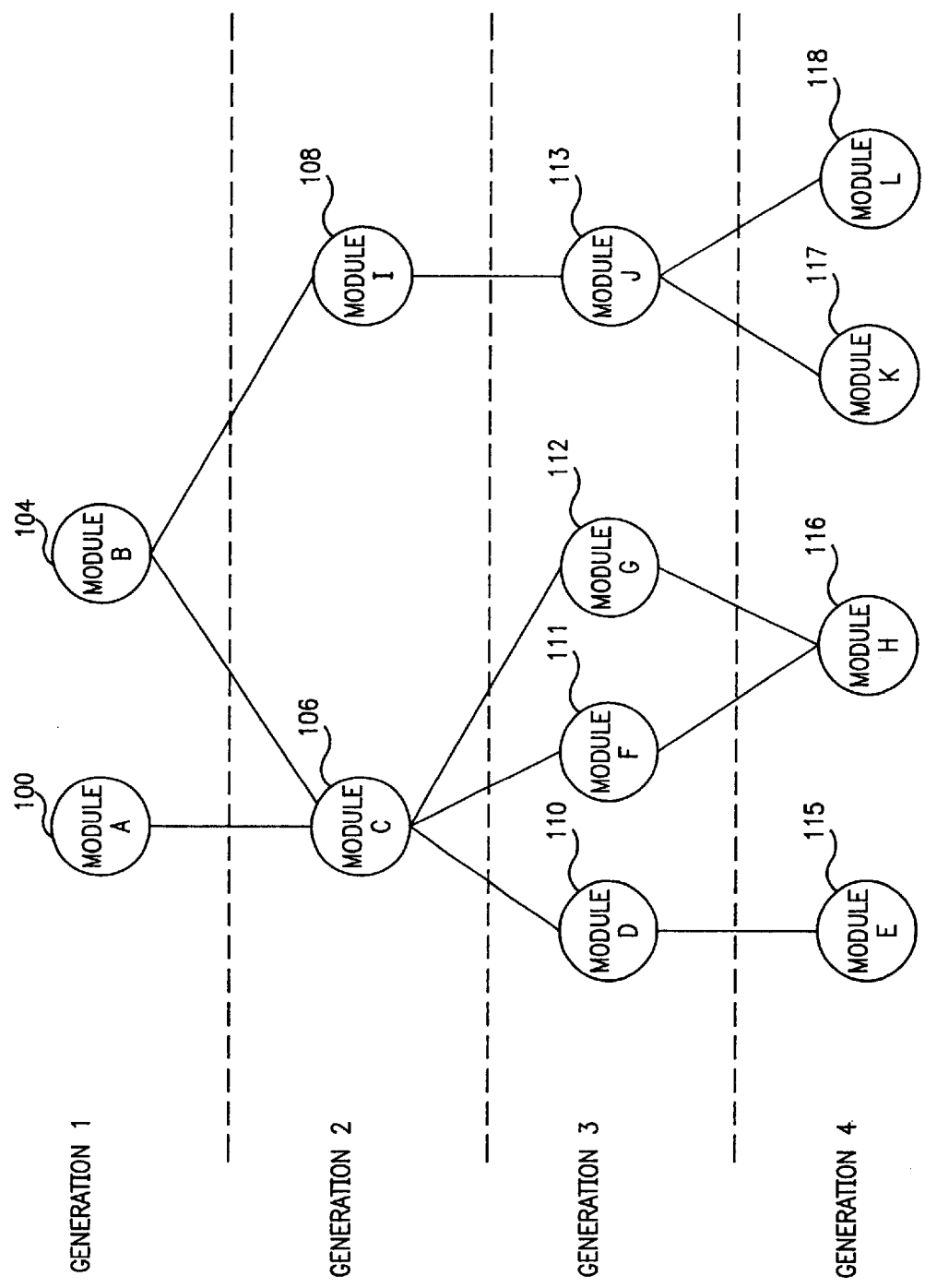
FIG. 8 shows an effective execution interdependency structure, following application of the method of the present invention to the modules shown in FIG. 2.

FIG. 4B shows the equivalency groups of generation 1 after the target modules have been selected and redundant modules replaced by references to the target modules. Left-pointing arrows indicate linked modules. For example, the left-pointing arrow from module 102 to module 100 indicates that module 102 has been linked to module 100. FIGS. 7A and 7B further illustrates how this structure is effected in the module directories.

The method steps are now complete for generation 1, and the steps are next applied to the generation 2 modules, 106, 107, 108 and 109.

In the case of FIG. 2, modules 106 and 107 are first assigned to the same potential equivalency group because they each have the same number of parent modules (two), and corresponding parent modules (100 and 102, and 101 and 103, respectively) are equivalent. Then, they are assigned to the same actual equivalency groups because they contain identical scripts.

Figure 5A:
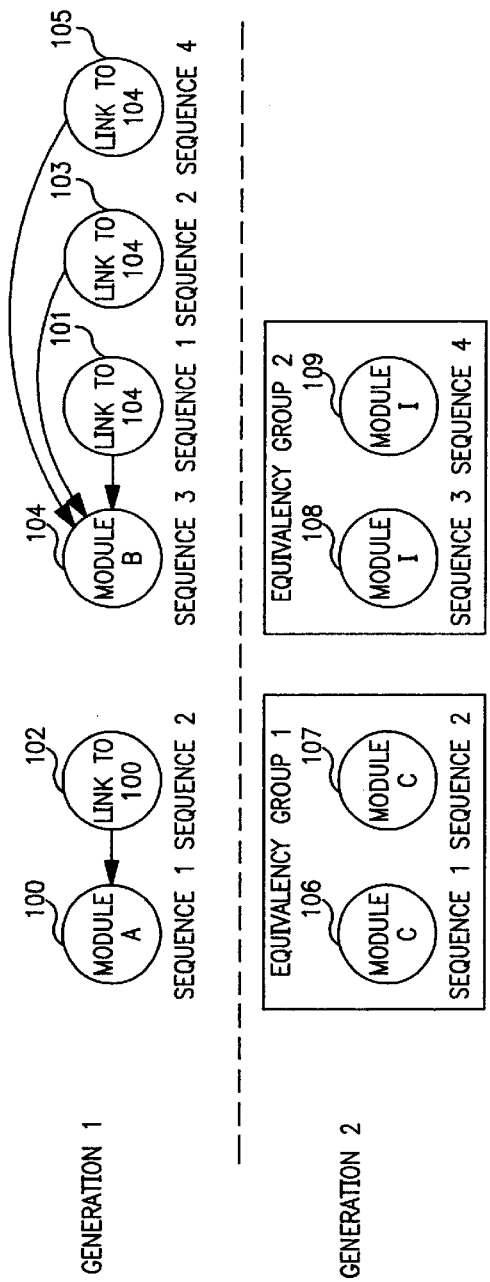
FIGS. 5A and 5B show generation 2 equivalency groups and subsequent links, respectively.
Figure 5B:
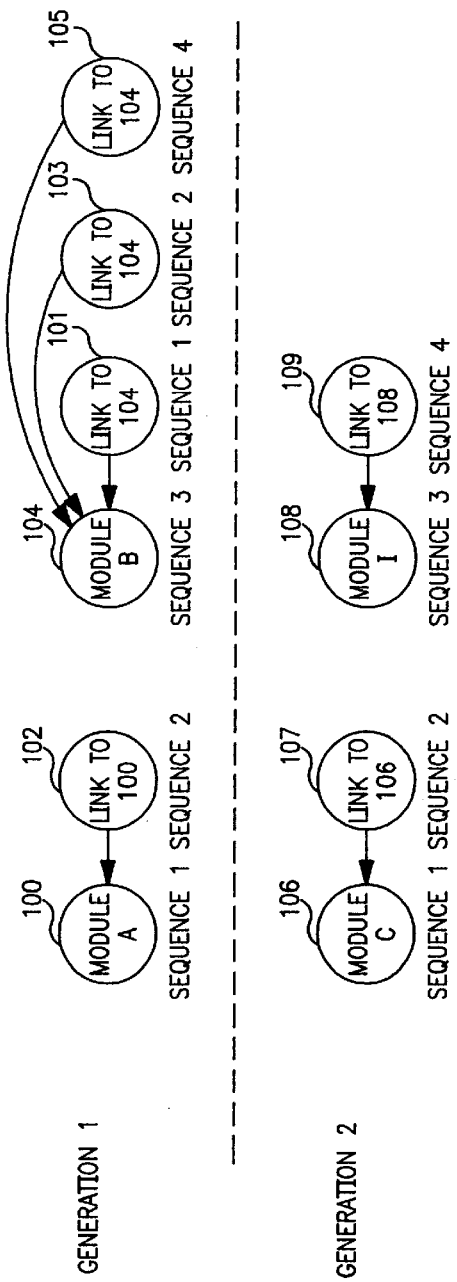

Similarly, modules 108 and 109 are assigned to the same equivalency group. FIG. 5A shows the equivalency groups for generation 2, and the links formed earlier for generation 1. Next, target modules are designated for the generation 2 modules, which results in the configuration shown in FIG. 5B, with module 107 being linked to module 106, and module 109 being linked to module 108.

Figure 6:
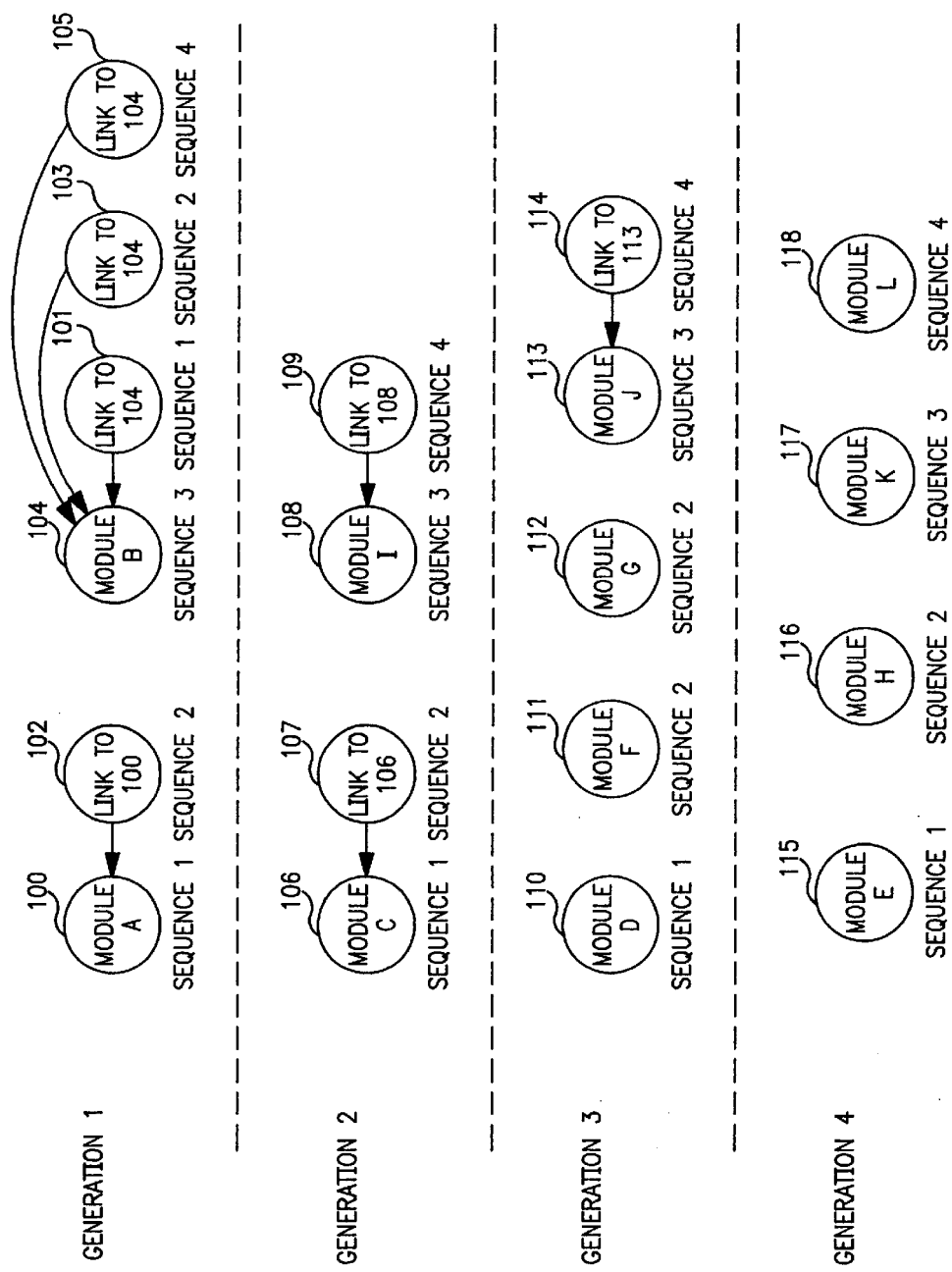
FIG. 6 shows the redefinition of execution interdependencies after application of the method of the present invention, in terms of target modules and associated linked (redundant) modules.

The foregoing process is applied to each generation, resulting in the structure shown in FIG. 6. The structure of FIG. 6 is reflected in FIGS. 7A and 7B, as the structure is implemented by the directory pointers. Redundant modules 101, 102, 103, 105, 107, 109 and 114 have all been replaced by references to equivalent target modules.

The collection of executable modules shown in FIG. 2 has now been optimized to eliminate a total of seven redundant modules. When the modules are executed as described above in the discussion of related application Ser. No. 09/239,943, the system of pointers shown in FIGS. 7A and 7B will reflect the correct interdependencies for each execution sequence, while avoiding the needless duplication of work. For example, module 111 shows module 107 as its parent.

However, when the parent execution status for module 111 is monitored to determine whether module 111 is ready to execute, it is the status of module 106 rather than module 107 which will be checked, because of the link from module 107 to module 106. Thus, although it was originally in a separate execution sequence, module 106 effectively becomes the parent of module 111, eliminating module 107 from the chain of interdependencies. The new, effective execution flow may be represented by a structure such as FIG. 8. The split in sequences 1 and 2 at generation 3 is now supplied by the single sequence of modules 100, 104 and 106, and the split in sequences 3 and 4 at generation 4 is supplied by the single sequence 104, 108 and 113.

The method of the present invention may be invoked by a user at any time to optimize the execution of a collection of modules generated as a group of related experiments in simulation modeling of semiconductor devices. In the preferred embodiment, a user invokes the software of the invention by clicking on an option provided in a pop-up menu in a user interface such as user interface 25, and selecting a group of executable modules as input. As noted above, the modules may be at various stages in the execution process; i.e., either awaiting execution, currently executing, or complete. Following reconstruction of execution interdependencies by application of the method, execution is thenceforward optimal in that redundant modules are eliminated.

As described earlier, the present invention may advantageously be embodied as computer-executable instructions on a computer-usable storage medium; the instructions may be retrieved into a computer memory and executed by a processor. When not being actively implemented, the instructions may reside on portable computer-usable media such as tape, floppy disks, hard disks, CD-ROMs and the like.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for optimizing the execution of a collection of modules representing steps in a simulation process and organized as generations of related sequences having execution interdependencies, comprising:

organizing the modules into groups of equivalent modules; and eliminating redundant modules in each group, wherein said eliminating step comprises:

for each group of equivalent modules in each generation, selecting a target module; and replacing all other modules with a reference to the target module, to redefine said execution interdependencies, wherein said target module is the most mature in terms of execution status.

2. The method of claim 1, wherein said organizing step comprises:

for each generation, comparing the modules to determine which are equivalent; and assigning equivalent modules to the same groups.

3. The method of claim 1, wherein said sequences include directed acyclic graph structures.

4. A method for optimizing the execution of a collection of modules representing steps in a simulation process and organized as generations of related sequences having execution interdependencies, each of said modules including information relating to execution prerequisites for said modules, comprising:

for two modules, comparing said information relating to execution prerequisites to determine whether the two modules have equivalent prerequisites;

comparing said two modules to determine whether, given the same input, they will produce the same output;

eliminating one of said two modules from said related sequences when said two modules have equivalent prerequisites and, given the same input, they will produce the same output; said method further comprising:

organizing said modules into groups of modules having equivalent execution prerequisites, by comparing said information relating to execution prerequisites;

for each of said groups having equivalent execution prerequisites, comparing each of said modules and assigning modules which, given the same input, will produce the same output, to the same groups; and for each group with a plurality of modules having equivalent execution prerequisites and which, given the same input, will produce the same output, replacing all modules except a target module with references to said target module, to redefine said execution interdependencies, wherein said target modules is the most mature in terms of execution status.

5. The method of claim 4 wherein said eliminating step comprises replacing said one module with a reference to the other of said two modules, to redefine said execution interdependencies.

6. A method for optimizing the execution of a collection of modules representing steps in a simulation process and organized as generations of related sequences having execution interdependencies, each of said modules including simulation control scripts and information relating to execution prerequisites for said modules, comprising:

for two modules, comparing said information relating to execution prerequisites to determine whether the two modules have equivalent prerequisites;

comparing said scripts in said two modules to determine whether the scripts are identical;

eliminating one of said two modules from said related sequences when said two modules have equivalent prerequisites and identical scripts; said method further comprising:

organizing said modules into groups of modules having equivalent execution prerequisites, by comparing said information relating to execution prerequisites;

for each of said groups having equivalent execution prerequisites, comparing said scripts in said modules and assigning modules with identical scripts to the same groups; and for each group with a plurality of modules having equivalent execution prerequisites and identical scripts, replacing all modules except a target module with references to said target module, to redefine said execution interdependencies, wherein said target module is the most mature in terms of execution status.

7. The method of claim 6 wherein said eliminating step comprises replacing said one module with a reference to the other of said two modules, to redefine said execution interdependencies.

8. A processing system for optimizing the execution of a collection of modules representing steps in a simulation process and organized as generations of related sequences having execution interdependencies, each of said modules including simulation control scripts and information relating to execution prerequisites for said modules, comprising:

means for comparing said information relating to execution prerequisites for two of said modules, to determine whether the two modules have equivalent prerequisites;

means for comparing said scripts in said two modules to determine whether the scripts are identical;

means for eliminating one of said two modules from said related sequences when said two modules have equivalent prerequisites and identical scripts;

means for organizing said modules into groups of modules having equivalent execution prerequisites, by comparing said information relating to execution prerequisites;

means for comparing said scripts in said modules and assigning modules with identical scripts to the same groups, for each of said groups having equivalent execution prerequisites; and means for replacing all modules except a target module with references to said target module, for each group with a plurality of modules having equivalent execution prerequisites and identical scripts, to redefine said execution interdependencies, wherein said target module is the most mature in terms of execution status.

9. The processing system of claim 8, wherein said means for eliminating comprises means for replacing said one module with a reference to the other of said two modules, to redefine said execution interdependencies.

10. A computer-usable medium storing instructions for implementing a method for optimizing the execution of a collection of modules representing steps in a simulation process and organized as generations of related sequences having execution interdependencies, each of said modules including simulation control scripts and information relating to execution prerequisites for said modules, said method comprising:

for two modules, comparing said information relating to execution prerequisites to determine whether the two modules have equivalent prerequisites;

comparing said scripts in said two modules to determine whether they are identical;

eliminating one of said two modules from said related sequences when said two modules have equivalent prerequisites and identical scripts, said method further comprising:

organizing said modules into groups of modules having equivalent execution prerequisites, by comparing said information relating to execution prerequisites;

for each of said groups having equivalent execution prerequisites, comparing said scripts in said modules and assigning modules with identical scripts to the same groups; and for each group with a plurality of modules having equivalent execution prerequisites and identical scripts, replacing all modules except a target module with references to said target module, to redefine said execution interdependencies, wherein said target module is the most mature in terms of execution status.

* * * * *